United States Patent
Tokano

(10) Patent No.: US 9,966,909 B2
(45) Date of Patent: May 8, 2018

(54) PREAMPLIFIER AND METHOD

(71) Applicant: Semiconductor Components Industries, LLC, Phoenix, AZ (US)

(72) Inventor: Takashi Tokano, Kumagaya (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 140 days.

(21) Appl. No.: 14/608,761

(22) Filed: Jan. 29, 2015

(65) Prior Publication Data

US 2016/0226459 A1 Aug. 4, 2016

(51) Int. Cl.
*H03F 3/183* (2006.01)
*H03F 1/26* (2006.01)

(52) U.S. Cl.
CPC ............... *H03F 3/183* (2013.01); *H03F 1/26* (2013.01); *H03F 2200/03* (2013.01); *H03F 2200/372* (2013.01); *H03F 2200/411* (2013.01)

(58) Field of Classification Search
CPC ........ H03F 3/181; H03F 3/185; H03F 1/3264; H03F 1/32; H03F 1/3211; H03F 1/34; H03F 1/342; H03F 3/183; H03F 1/26; H03F 2200/03; H03F 2200/372; H03F 2200/411; H04R 19/04; H04R 19/016; H04R 3/00; H04R 2201/003; H04R 2410/03
USPC ................ 381/120, 111–115, 95; 330/75, 85
See application file for complete search history.

(56) References Cited

U.S. PATENT DOCUMENTS

| | | | | |
|---|---|---|---|---|
| 5,488,321 A | * | 1/1996 | Johnson | H03F 3/345 327/312 |
| 5,712,593 A | * | 1/1998 | Buer | H03G 3/3042 330/129 |
| 6,118,308 A | * | 9/2000 | Sander | H03K 5/2481 327/66 |
| 6,771,122 B2 | * | 8/2004 | Jin | H03F 3/45973 330/259 |
| 7,756,279 B2 | * | 7/2010 | Deruginsky | H03F 1/3211 330/259 |
| 8,824,703 B2 | * | 9/2014 | Lesso | H03F 1/304 381/120 |

(Continued)

FOREIGN PATENT DOCUMENTS

JP 2003-332860 A 11/2003
JP 2006-038645 A 2/2006

*Primary Examiner* — Jason R Kurr
(74) *Attorney, Agent, or Firm* — Rennie William Dover

(57) ABSTRACT

In accordance with an embodiment, an amplification circuit includes an amplifier connected to a filter, wherein the amplifier has an input and an output and the filter has an input connected to the output of the amplifier. The amplification circuit includes a comparator that has an input connected to the output of the filter and an input coupled for receiving a reference voltage. The output of the comparator is connected to the input of the amplification circuit. In accordance with another embodiment, a method for generating an output signal is provided that includes generating an amplified signal by amplifying a signal that has an input portion and a feedback portion. A comparison signal is generated in response to comparing the signal with a reference signal and the comparison signal is used to set the output voltage to be substantially equal to the reference voltage.

15 Claims, 4 Drawing Sheets

(56) References Cited

U.S. PATENT DOCUMENTS

| | | | | |
|---|---|---|---|---|
| 2002/0000883 A1* | 1/2002 | Cox | ................... | H03F 3/45183 |
| | | | | 330/277 |
| 2013/0266156 A1* | 10/2013 | Frohlich | ................... | H03F 1/34 |
| | | | | 381/120 |
| 2014/0037112 A1* | 2/2014 | Lee | ........................ | H03F 1/56 |
| | | | | 381/120 |
| 2015/0229273 A1* | 8/2015 | Liu | ..................... | G09G 3/3677 |
| | | | | 345/98 |

* cited by examiner

PREAMPLIFIER AND METHOD

BACKGROUND

The present invention relates, in general, to electronics and, more particularly, to methods of forming semiconductor devices and structure.

In the past, audio amplifiers have been used to convert acoustic signals into electrical signals which can drive speakers. Audio amplifiers have become widely used in devices such as, for example, mobile phones, personal computers, laptops, notebooks, Tablets, etc. and typically include a microphone amplifier circuit configured to convert the audio signal into an electrical signal. One type of microphone amplifier circuit includes a digital MEMS (Micro Electro Mechanical Systems) microphone module. A digital MEMS microphone module typically includes a MEMS microphone having a terminal connected to a charge pump and another terminal connected to a preamplifier having an output connected to an analog to digital converter, which generates a digital output signal from an audio signal. A figure of merit for microphone amplifier circuits is the signal to noise ratio (SNR). A source of noise in digital MEMS microphone modules is at the preamplifier stage.

Accordingly, it would be advantageous to have microphone amplifier circuit which enhances the SNR and expands the dynamic range of the microphone amplifier circuit. It is desirable for the circuit and method to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
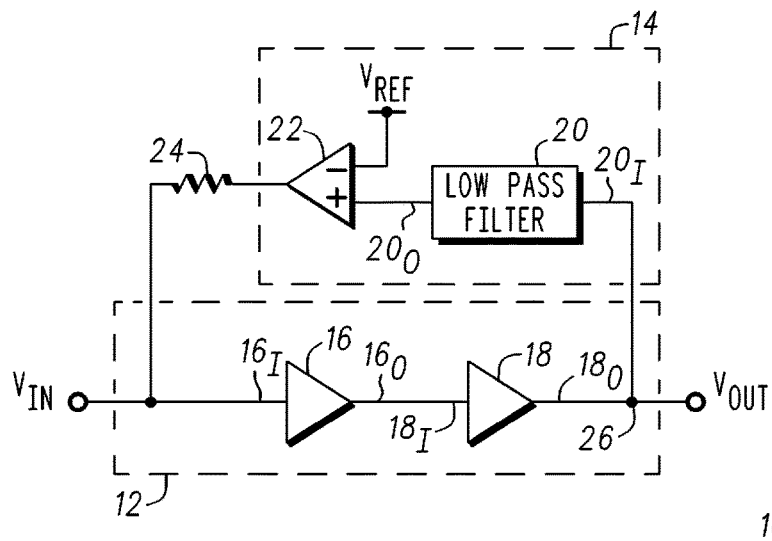
FIG. 1 is a circuit schematic of a preamplifier suitable for use in a microphone in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage or logic low voltage level and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level, a logic high voltage, or a logic one voltage and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

Generally, the present invention provides a structure and method for increasing the signal to noise ratio of a circuit such as a preamplifier that can be used in a digital MEMS microphone. A preamplifier is typically referred to as a preamp. In accordance with an embodiment, the amplification circuit comprises a filter having an input connected to an output of a first amplifier. An output of the first filter is connected to a first input of a first comparator and a reference voltage is coupled to the second input of the first comparator. The output of the first comparator is connected to an input of the first amplifier.

In accordance with another embodiment, a method for generating an output signal is provided that comprises providing first input signal at a first input of an amplifier, wherein the first input signal includes an input portion and a feedback portion. The input signal is amplified to generate an amplified signal at the output of the amplifier and the output signal is used to generate a comparison signal by comparing a first signal with a reference signal, wherein the first signal is generated in response to the output signal. A feedback portion of the input signal is generated based on the comparison signal.

In accordance with an aspect the amplified signal is filtered to generate the first signal.

FIG. 1 is a circuit schematic of a preamplifier 10 suitable for use in a microphone such as, for example, a capacitor microphone, in accordance with an embodiment of the present invention. What is shown in FIG. 1 is an amplifier circuit 12 coupled to an output DC (direct current) control circuit 14. More particularly, amplifier circuit 12 includes a single amplifier 16 coupled to an output drive circuit 18, wherein single amplifier 16 has a single input $16_I$ and an output $16_O$. Single input $16_I$ is connected to or, alternatively, serves as an input of amplifier circuit 12 and output $16_O$ is connected to an input $18_I$ of output drive circuit 18. An output $18_O$ of output drive circuit 18 serves as, or alternatively, is coupled to an output of amplifier circuit 12. Amplifier circuit 12 may be referred to as a gain stage and output drive circuit 18 may be referred to as a driver. Output $18_O$ may be connected to an input $20_I$ of low pass filter 20 to form a node 26, which may serve as an output of preamplifier 10. DC control circuit 14 includes a low pass filter 20 connected to a comparator 22. Low pass filter 20 has an input $20_I$ connected to output $18_O$ and an output $20_O$ connected to a noninverting input of comparator 22. Comparator 22 has an inverting input coupled for receiving a reference voltage $V_{REF}$ and an output. An impedance element 24 has a first terminal connected to the output of comparator 22 and a second terminal connected to single input $16_I$. By way of example impedance element 24 is a resistor. Output $16_O$ is connected to input $18_I$ of drive circuit 18 and output $18_O$ is connected to input $20_I$ of low pass filter 20 at output 26. Output 26 may also be referred to as node 26. It should be noted that comparator 22 has a gain which is preferably designed to be low, i.e., less than about 50 decibels, so that the feedback loop created by connecting control circuit 14 to amplifier circuit 12 is stable.

In operation, an input signal $V_{IN}$ is coupled to or provided to input $12_I$ and amplified by amplifier circuit 12. In response to the amplification, an amplified input signal is generated at output $18_O$. High frequency components of the amplified input signal are removed or filtered by low pass filter 20 to generate a filtered output signal at the noninverting input of comparator 22. A comparison signal is generated at the output of comparator 22 in response to comparing the filtered signal appearing at its noninverting input with reference voltage $V_{REF}$. The comparison voltage is fed back to input $16_I$ through impedance element 24 and serves as a feedback signal that serves to adjust the voltage at output $20_O$ to be substantially equal to reference voltage $V_{REF}$. In accordance with an embodiment, preamp circuit 10 is configured so that voltage $V_{REF}$ is selected to be substantially equal to one-half the difference between an upper supply voltage $V_{DD}$ and a lower supply voltage $V_{SS}$, i.e., $(V_{DD}-V_{SS})/2$). In accordance with embodiments in which the lower supply voltage $V_{SS}$ is ground, amplifier circuit 12 generates a voltage substantially equal to one-half the supply voltage $V_{DD}$, i.e., $V_{DD}/2$. For example, voltage $V_{REF}$ may be set to be 0.8 volts in response to upper supply voltage $V_{DD}$ being equal to 1.6 volts and the lower supply voltage $V_{SS}$ being equal to zero volts. In this configuration, the ac voltage at node 26 has the largest dynamic range.

Figure 2:
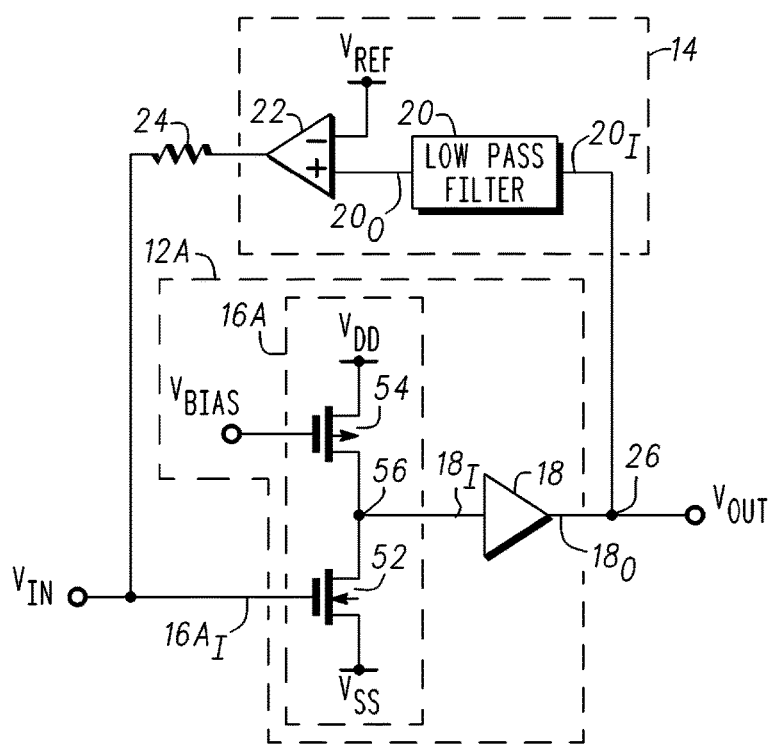
FIG. 2 is a circuit schematic of a preamplifier suitable for use in a microphone in accordance with another embodiment of the present invention.

FIG. 2 is a circuit schematic of a preamplifier 50 suitable for use in a microphone such as, for example a capacitor microphone, in accordance with another embodiment of the present invention. Preamplifier 50 includes an amplifier circuit 12A connected to DC control circuit 14. Amplifier circuit 12A may be referred to as a gain stage. DC control circuit 14 was described with reference to FIG. 1. Amplifier circuit 12A includes a gain stage 16A connected to output drive circuit 18 described with reference to FIG. 1. It should be noted that reference character A has been appended to reference characters 12 and 16 to distinguish embodiments of the amplifier circuits and the gain stages. Thus, amplifier circuit 12 differs from amplifier circuit 12A in the configuration of the gain stage, where the configuration of gain stage 16A may be different from that of gain stage 16. In accordance with an embodiment, gain stage 16A includes a transistor 52 connected to a transistor 54. Transistors 52 and 54 each have a control terminal, and a pair of current carrying terminals. As discussed above, the control terminals may be referred to as gate terminals, gate electrodes, or gates and the current carrying terminals may be referred to as current carrying electrodes, or one of the current carrying terminals may be referred to as a drain, a drain terminal, or a drain electrode and the other current carrying terminal may be referred to as a source, a source terminal, or a source electrode.

In the embodiment shown in FIG. 2, the drain terminal of transistor 52 is connected to the drain terminal of transistor 54 to form a node 56, the source terminal of transistor 52 is coupled for receiving a source of operating potential $V_{SS}$ and the source terminal of transistor 54 is coupled for receiving a source of operating potential $V_{DD}$. The gate terminal of transistor 52 is coupled for receiving an input signal $V_{IN}$ and the gate terminal of transistor 54 is coupled for receiving a bias voltage $V_{BIAS}$. It should be noted that potential $V_{SS}$ may be a ground potential. Node 56 is connected to input $18_I$ of drive circuit 18 and output $18_O$ is connected to input $20_I$ of low pass filter 20 at node 26, which serves as an output of preamp 50.

In operation, and in response to an input signal $V_{IN}$ at input $16A_I$, i.e., the gate terminal of transistor 52, an amplified voltage is generated at node 56, which is transmitted to output $18_O$ through drive circuit 18. High frequency components of the amplified signal at output $18_O$ are removed or filtered by low pass filter 20 to generate a filtered output signal at the noninverting input of comparator 22. A comparison signal is generated at the output of comparator 22 in response to comparing the filtered signal appearing at its noninverting input with reference voltage $V_{REF}$. The comparison voltage is fed back to input $16A_I$ through impedance element 24 and serves as a feedback signal that serves to adjust the voltage at output $20_O$ to be substantially equal to reference voltage $V_{REF}$. In accordance with an embodiment, preamp circuit 50 is configured so that voltage $V_{REF}$ is selected to be substantially equal to one-half the difference between an upper supply voltage $V_{DD}$ and a lower supply voltage $V_{SS}$, i.e., $(V_{DD}-V_{SS})/2$). In accordance with embodiments in which the lower supply voltage $V_{SS}$ is ground, amplifier circuit 12A generates a voltage substantially equal to one-half the supply voltage $V_{DD}$, i.e., $V_{DD}/2$. For example, voltage $V_{REF}$ may be set to be 0.8 volts in response to upper supply voltage $V_{DD}$ being equal to 1.6 volts and the lower supply voltage $V_{SS}$ being equal to zero volts. In this configuration, the ac voltage at node 26 has its largest dynamic range.

Figure 3:
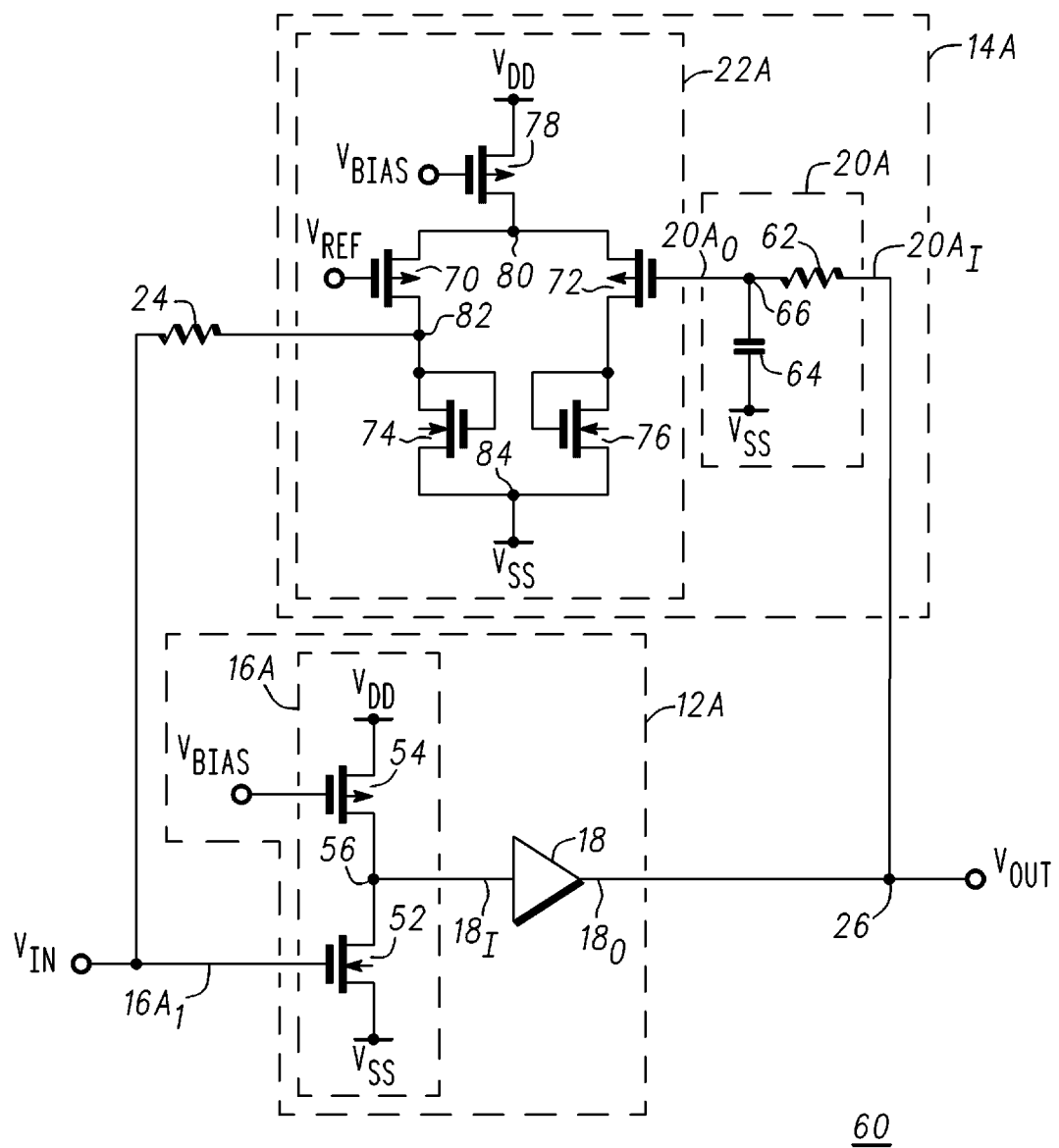
FIG. 3 is a circuit schematic of a preamplifier suitable for use in a microphone in accordance with another embodiment of the present invention.

FIG. 3 is a circuit schematic of a preamplifier 60 suitable for use in for example, a capacitor microphone, in accordance with another embodiment of the present invention. Preamplifier 60 includes an amplifier circuit 12A having an output connected to an input of a DC control circuit 14A, where an output of DC control circuit 14A is connected to an input of amplifier 12A through an impedance element 24. By way of example, impedance element 24 is a resistor. Amplifier circuit 12A including gain stage 16A connected to output drive circuit 18 have been described with reference to FIGS. 1 and 2. It should be noted that reference character A has been appended to reference character 14 to distinguish embodiments of the DC control circuits from each other. Thus, DC control circuit 14A differs from DC control circuit 14 in the configuration of the filter and the comparator, where the configuration of filter 20A may be different from the configuration of filter 20 or the configuration of comparator 14A may be different from the configuration of comparator 14. In accordance with an embodiment, low pass filter 20 includes a resistor 62 and a capacitor 54, where resistor 62 has a terminal that may be connected to or, alternatively, serves as input $20_I$ of low pass filter 14A. Capacitor 64 has a terminal coupled for receiving a source of potential $V_{SS}$ and a terminal coupled to the other terminal of resistor 62 to form a node 66 that may be connected to or, alternatively, serve as an output $20A_O$ of low pass filter 20A. Potential $V_{SS}$ may be, for example, ground potential.

In accordance with an embodiment, comparator 22A includes transistors 70, 72, 74, 76, and 78. Like transistors 52 and 54, transistors 70, 72, 74, 76, and 78 each have a control terminal, and a pair of current carrying terminals. As discussed above, the control terminals may be referred to as gate terminals, gate electrodes, or gates and the current carrying terminals may be referred to as current carrying electrodes, or one of the current carrying terminals may be referred to as a drain, a drain terminal, or a drain electrode and the other current carrying terminal may be referred to as a source, a source terminal, or a source electrode.

In the embodiment shown in FIG. 3, the source terminal of transistor 70 is connected to the source terminal of transistor 72 to form a node 80, the drain terminal of transistor 70 is connected to the drain terminal of transistor 74 to form a node 82, and the drain terminal of transistor 72 is connected to the drain terminal of transistor 76. Node 82 serves as the output of comparator 22A and is connected to input $16A_I$ through impedance element 24, which impedance element 24 was described with reference to FIG. 1. The source terminal of transistor 74 is connected to the source terminal of transistor 76 to form a node 84. The source terminal of transistor 74 is coupled for receiving a source of operating potential $V_{SS}$ at node 84 and the source terminal of transistor 76 is coupled for receiving a source of operating potential $V_{SS}$ at node 84. By way of example, operating potential $V_{SS}$ is ground. The gate terminal of transistor 70 is coupled for receiving a reference voltage $V_{REF}$ and the gate terminal of transistor 72 is connected to output terminal $20A_O$ of low pass filter 20. The gate terminal of transistor 74 is connected to the drain terminal of transistor 74 to form a diode connected transistor and the gate terminal of transistor 76 is connected to the drain terminal of transistor 76 to form a diode connected transistor.

Transistor 78 has a source terminal coupled for receiving a source of operating potential $V_{DD}$, a drain terminal connected to node 80, i.e., connected to the source terminals of transistors 70 and 72, and a gate terminal coupled for receiving reference voltage $V_{BIAS}$. Transistor 78 may be configured to serve as a current source.

As those skilled in the art are aware, transistors 52, 54, 70, 72, 74, 76, and 78 each have a width to length ratio. The width to length ratio of transistor 52 is given as $W_{52}/L_{52}$ and for the sake of clarity may be labeled $S_{52}$. Likewise, the width to length ratio of transistor 54 is given as $W_{54}/L_{54}$ and for the sake of clarity may be labeled $S_{54}$; the width to length ratio of transistor 70 is given as $W_{70}/L_{70}$ and for the sake of clarity may be labeled $S_{70}$; the width to length ratio of transistor 72 is given as $W_{72}/L_{72}$ and for the sake of clarity may be labeled $S_{72}$; the width to length ratio of transistor 74 is given as $W_{74}/L_{74}$ and for the sake of clarity may be labeled $S_{74}$; the width to length ratio of transistor 76 is given as $W_{76}/L_{76}$ and for the sake of clarity may be labeled $S_{76}$; and the width to length ratio of transistor 78 is given as $W_{78}/L_{78}$ and for the sake of clarity may be labeled $S_{78}$. In accordance with an embodiment, transistors 52, 54, 74, and 78 are sized such that:

$$S_{52}/S_{54}=2*S_{74}/S_{78} \qquad \text{EQT. 1}$$

Selecting the dimensions of transistors 52, 54, 74, and 78 in accordance with EQT 1 (Equation 1) sets the voltage at the gate of transistor 52 to be equal to the voltage at the gate of transistor 74. In accordance with an embodiment, transistors 70, 72, 74, 76, and 78 are configured such that the drain currents of transistor 70, 72, 74, and 76 are substantially equal and are about one-half the drain current of transistor 78. Thus, the gate voltages of transistors 74 and 76 are substantially equal and the gate voltages of transistors 70 and 72 are substantially equal. It should be noted that the gate voltage of transistor 70 is equal to reference voltage $V_{REF}$. Setting the dimensions of transistors 52, 54, 74, and 78 in accordance with EQT 1, sets the gate voltages of transistor 52, 74, and 76 to be substantially equal. The gate voltages of transistors 54 and 78 are substantially equal to bias voltage $V_{BIAS}$. Therefore the gate voltages of transistors 70 and 72 are substantially equal to reference voltage $V_{REF}$. Comparator 22A is configured to have a low gain, which provides feedback loop stability and results in output voltage $V_{OUT}$ at node 26 being substantially equal to reference voltage $V_{REF}$ in response to selecting the dimensions of transistors 52, 54, 74, and 78 in accordance with EQT 1. A low gain may be, for example, less than about 50 decibels.

Thus, comparator 22A compares voltage $V_{REF}$ at the gate of transistor 70 with the voltage output from low pass filter 20A at the gate of transistor 72 and generates a comparison signal at node 82 which results in output voltage $V_{OUT}$ at node 26 being substantially equal to reference voltage $V_{REF}$.

Figure 4:
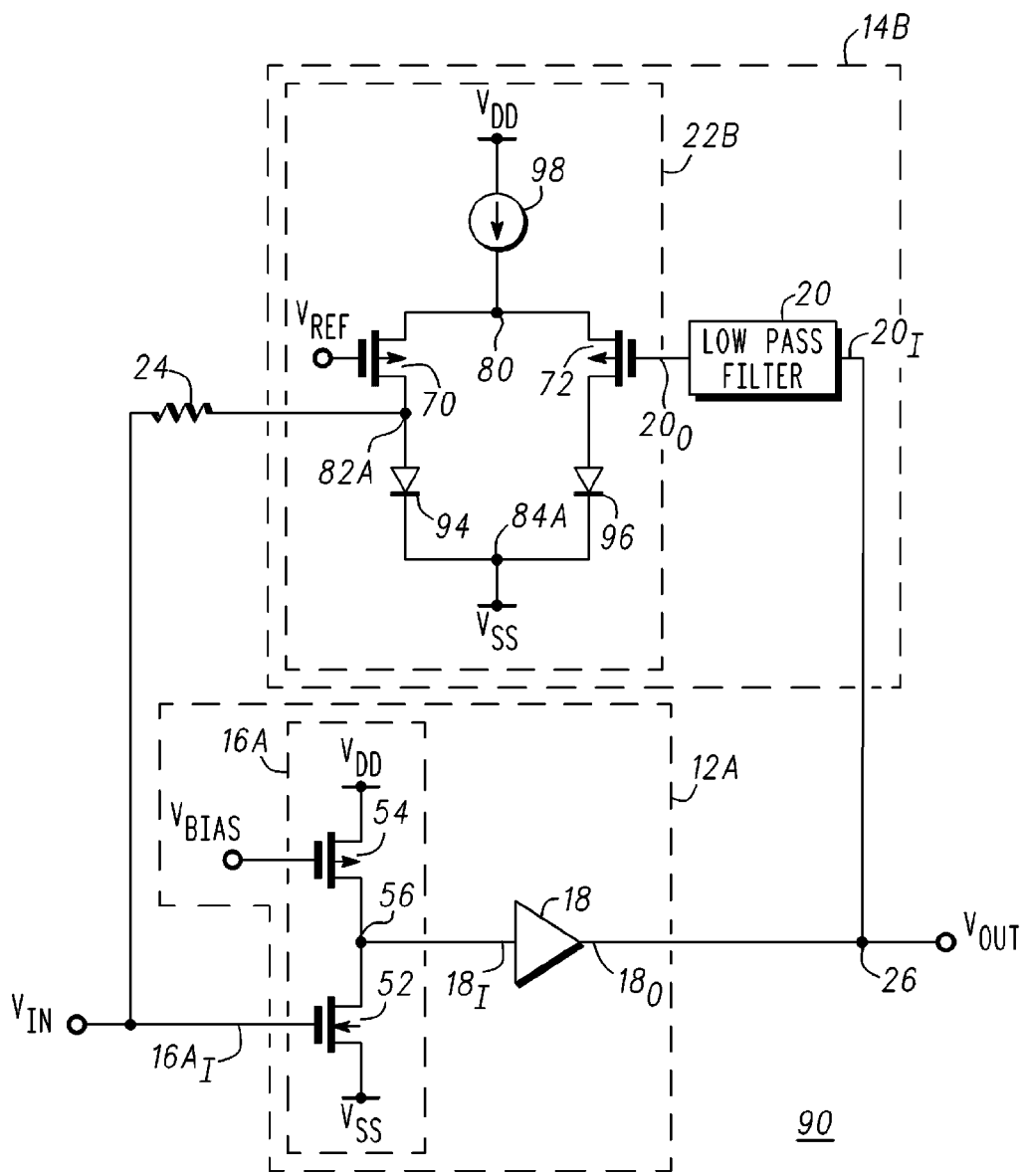
FIG. 4 is a circuit schematic of a preamplifier suitable for use in a microphone in accordance with another embodiment of the present invention.

FIG. 4 is a circuit schematic of a preamplifier 90 suitable for use in, for example, a capacitor microphone in accordance with another embodiment of the present invention. Preamplifier 90 includes an amplifier circuit 12A having an output connected to an input of a DC control circuit 14B, where an output of DC control circuit 14B is connected to an input of amplifier 12A through an impedance element 24. Amplifier circuit 12A and low pass filter 20 have been described with reference to FIGS. 1 and 2. It should be noted that reference character B has been appended to reference character 14 to distinguish embodiments of the DC control circuits and to reference character 22 to distinguish the comparators from each other. DC control circuit 14B differs from DC control circuit 14 in the configuration of the comparator, where the configuration of comparator 14B may be different from the configuration of comparator 14. In addition reference character A has been appended to reference characters 82 and 84 to distinguish the connections that form nodes 82A and 84A from the connections that form nodes 82 and 84 of preamplifier 60. In accordance with an embodiment, comparator 22B differs from comparator 22A in that transistors 74 and 76 of comparator 22A have been replaced by diodes 94 and 96, respectively, and transistor 78 has been replaced by a current source 98. Diode 94 has an anode connected to the drain terminal of transistor 70 to form node 82A and diode 96 has an anode connected to the drain terminal of transistor 72. The anodes of diodes 94 and 96 may be referred to as terminals or electrodes. Likewise, the cathodes diodes 94 and 96 may be referred to as terminals or electrodes. Node 82A serves as an output of comparator 14B and is connected to input $16A_I$ through impedance element 24. Diodes 94 and 96 each have a cathode commonly connected together to form node 84A and for receiving source of operating potential $V_{SS}$. By way of example, operating potential $V_{SS}$ is at ground potential.

Figure 5:
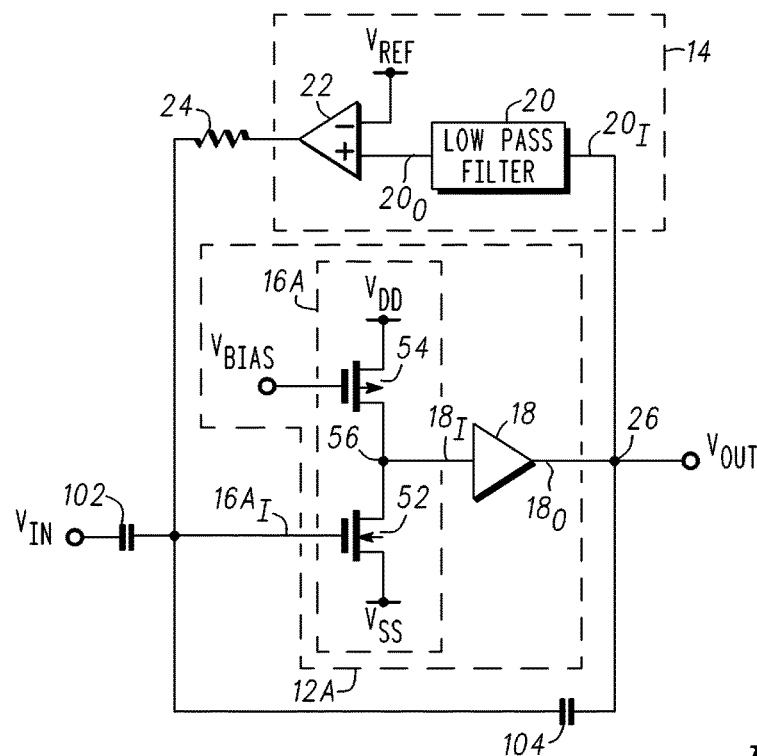
FIG. 5 is a circuit schematic of a preamplifier suitable for use in a microphone in accordance with another embodiment of the present invention.

FIG. 5 is a circuit schematic of a preamplifier 100 suitable for use in, for example, a capacitor microphone, in accordance with another embodiment of the present invention. Preamplifier 100 includes an amplifier circuit 12A having an output connected to an input of a DC control circuit 14, which output of DC control circuit 14 has an output connected to an input of amplifier 12A through an impedance element 24. Amplifier circuit 12A and low pass filter 20 have been described with reference to FIGS. 1 and 2. In accordance with an embodiment, preamplifier 100 includes an energy storage element 102 having a terminal connected to input $16A_I$ and a terminal coupled for receiving input voltage $V_{IN}$. Preamplifier 100 further includes an energy storage element 104 having a terminal connected to input $16A_I$ and a terminal connected to output 26. By way of example, energy storage elements 102 and 104 are capacitors.

The dc (direct current) operation of preamplifier 100 is similar to that described with reference to FIG. 2, wherein a feedback loop sets the voltage $V_{OUT}$ to be substantially equal to reference voltage $V_{REF}$. Capacitors 102 and 104 serve to amplify the alternating current (ac) signal appearing at input $16A_I$, wherein the amplified signal appears at output or node 26.

Figure 6:
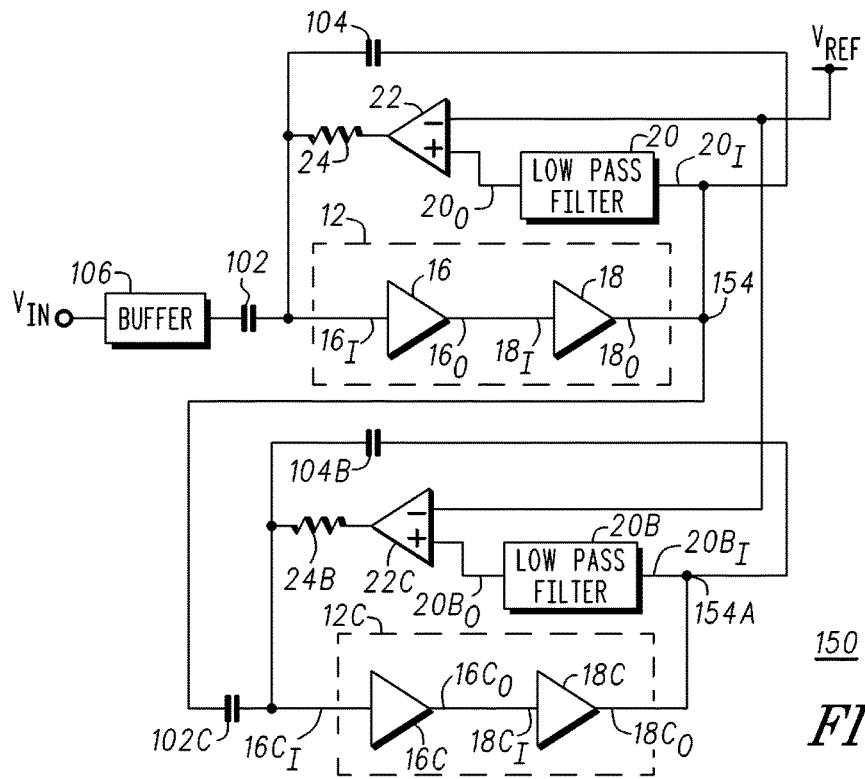
FIG. 6 is a circuit schematic of a preamplifier suitable for use in a capacitor microphone in accordance with another embodiment of the present invention.

FIG. 6 is a circuit schematic of a preamplifier 150 suitable for use in, for example, a capacitor microphone, in accordance with an embodiment of the present invention. What is shown in FIG. 6 is an amplifier circuit 12 coupled to a comparator 22 and to a low pass filter 20. As discussed with reference to FIG. 1, amplifier circuit 12 includes a single amplifier 16 coupled to an output drive circuit 18, wherein single amplifier 16 has a single input $16_I$ and an output $16_O$. Single input $16_I$ is connected to or, alternatively, serves as an input of amplifier circuit 12 and output $16_O$ is connected to an input $18_I$ of output drive circuit 18. An output $18_O$ of output drive circuit 18 serves as or, alternatively, is coupled to an output 154 of amplifier circuit 12. A low pass filter 20 has an input $20_I$ connected to output 154 and an output connected to the noninverting input of comparator 22. Comparator 22 has an output connected to input $16_I$ through a resistor 24, wherein resistor 24 has a terminal connected to the output of comparator 22 and a terminal connected to input $16_I$. A capacitor 104 has a terminal commonly connected to output 154 of amplifier 12 and to input $20_I$ of low pass filter 20. The other terminal of capacitor 104 is connected to input $16_I$ of gain stage 16. Comparator 22 has an inverting input connected to a reference voltage $V_{REF}$.

Preamplifier 150 further includes an amplifier circuit 12C comprising a single amplifier 16C coupled to an output drive circuit 18C, wherein single amplifier 16C has a single input $16C_I$ and an output $16C_O$. Single input $16C_I$ is connected to or, alternatively, serves as an input of amplifier circuit 12C and output $16C_O$ is connected to an input $18C_I$ of output drive circuit 18C. An output $18C_O$ of output drive circuit 18C serves as or, alternatively, is coupled to an output 154A of amplifier circuit 12C. A low pass filter 20B has an input $20B_I$ connected to output 154A and an output connected to the noninverting input of a comparator 22C. Comparator 22C has an output connected to input $16_I$ through a resistor 24B, wherein resistor 24B has a terminal connected to the output of comparator 22C and a terminal connected to input $16C_I$ of gain stage 16C. A capacitor 104B has a terminal commonly connected to the output 154A of amplifier circuit 12C and to the input $20_I$ of low pass filter 20B. The other terminal of capacitor 104B is connected to input $16C_I$. Comparator 22C has an inverting input connected to a reference voltage $V_{REF}$.

A buffer 106 is coupled to the input of amplifier circuit 12. More particularly, buffer 106 has a terminal coupled for receiving input voltage $V_{IN}$ and an output terminal connected to a terminal of energy storage element 102. The other terminal of energy storage element 102 is connected to input $16C_I$ amplifier circuit 12C.

It should be noted that in accordance with another embodiment, gain stages 16 and 16C may be comprised of a transistor configuration such as gain stage 16A described with reference to FIG. 2, comparator 22C may be comprised of a transistor configuration such as the configuration of comparator 22B described with reference to FIG. 4, and comparator 22C may be comprised of a transistor configuration, a diode configuration, and a current source configuration such as the corresponding transistors, diodes, and current source described with reference to FIG. 4.

By now it should be appreciated that a preamplifier and a method for generating an output signal have been provided. In accordance with embodiments of the present invention, an amplifier having a single input is used to set the output dc voltage to a desired level. For example, setting the output voltage at a value substantially equal to one-half the difference of the supply voltages allows for the ac output signal to swing over a full range. In one embodiment, the dc level of the output voltage is set to a value substantially equal to $V_{DD}/2$, wherein the lower supply level $V_{SS}$ is set at a ground potential. In accordance with another embodiment, a comparator used to generate a feedback signal is configured to have a low gain. For example, the gain may be less than 50 decibels and may be equal to or less than substantially 20 decibels.

Although specific embodiments have been disclosed herein, it is not intended that the invention be limited to the disclosed embodiments. Those skilled in the art will recognize that modifications and variations can be made without departing from the spirit of the invention. For example, junction field effect transistors, bipolar transistors or the like may be used instead of field effect transistors. In addition, the configurations of the transistors, i.e., the use of n-channel transistors and p-channel transistors, is not limited those described herein. It is intended that the invention encompass all such modifications and variations as fall within the scope of the appended claims.

What is claimed is:

1. An amplification circuit, comprising:
   a first amplifier having a single ended input and an output;
   a first filter having an input and an output, the input of the first filter coupled to the output of the first amplifier;
   a first comparator having a first input, a second input, and an output, the second input of the first comparator coupled for receiving a reference voltage and the output of the first comparator coupled to the single ended input of the first amplifier to provide a feedback signal that adjusts the signal at the output of the first filter; and
   a resistor having a first terminal and a second terminal, the first terminal of the resistor coupled to the output of the first comparator and the second terminal of the resistor coupled to the single ended input of the first amplifier.

2. The amplification circuit of claim 1, wherein the first input of the first comparator is coupled to the output of the first filter.

3. The amplification circuit of claim 1, wherein the first filter is a low pass filter.

4. The amplification circuit of claim 1, wherein the first amplifier comprises:
a first transistor having a control terminal, a first current carrying terminal, and a second current carrying terminal;
a second transistor having a control terminal, a first current carrying terminal, and a second current carrying terminal, the first current carrying terminal of the first transistor coupled to the second current carrying terminal of the second transistor to form a first node, the control terminal of the first transistor serving as the single ended input of the first amplifier, and the control terminal of the second transistor coupled for receiving a bias voltage; and
a driver having an input and an output, the input of the driver coupled to the first node and the output of the driver coupled to the input of the first filter.

5. The amplification circuit of claim 4, wherein the first comparator comprises:
a third transistor having a control terminal, a first current carrying terminal, and a second current carrying terminal, the control terminal of the third transistor serving as the first input of the first comparator; and
a fourth transistor having a control terminal, a first current carrying terminal, and a second current carrying terminal, the first current carrying terminal of the fourth transistor coupled to the first current carrying terminal of the third transistor, the control terminal of the fourth transistor serving as the second input of the first comparator;
a first diode having a first terminal and a second terminal, the first terminal of the first diode coupled to the second current carrying terminal of the fourth transistor to form the output of the comparator; and
a second diode having a first terminal and a second terminal, the first terminal of the second diode coupled to the second current carrying terminal of the third transistor.

6. The amplification circuit of claim 5, further including a current source having a first terminal and a second terminal, the first terminal of the current source coupled for receiving a first source of operating potential and the second terminal of the current source coupled to the first current carrying terminals of the third and fourth transistors.

7. The amplification circuit of claim 6, wherein the current source comprises a fifth transistor having a control terminal, a first current carrying terminal, and a second current carrying terminal, the control terminal of the fifth transistor coupled for receiving the bias voltage, the second current carrying terminal serving as the first terminal of the current source, and the second current carrying terminal serving as the second terminal of the current source.

8. The amplification circuit of claim 7, wherein
the first diode comprises a sixth transistor having a control terminal, a first current carrying terminal, and a second current carrying terminal, the control terminal of the sixth transistor coupled to the first current carrying terminal of the sixth transistor to form the first terminal of the first diode; and
the second diode comprises a seventh transistor having a control terminal, a first current carrying terminal, and a second current carrying terminal, the control terminal of the seventh transistor coupled to the first current carrying terminal of the seventh transistor to form the first terminal of the second diode.

9. The amplification circuit of claim 8, wherein the first transistor, the second transistor, the fifth transistor, and the sixth transistor are sized so that a voltage at the first node equals one-half a value equal to a difference between the first operating potential and the second operating potential, the first operating potential coupled to the first current carrying terminal of the second transistor and the second operating potential coupled to the second current carrying terminal of the first transistor.

10. The amplification circuit of claim 9, further including:
a second amplifier having an input and an output;
a second filter having an input and an output, the input of the second filter coupled to the output of the second amplifier; and
a second comparator having a first input, a second input, and an output, the first input of the second comparator coupled to the output of second the filter, the second input of the second comparator coupled for receiving the reference voltage, and the output of the second comparator coupled to the input of the second amplifier.

11. The amplification circuit of claim 10, further including
a first resistor having a first terminal and a second terminal, the first terminal of the first resistor coupled to the output of the first comparator and the second terminal of the first resistor coupled to the single ended input of the first amplifier;
a second resistor having a first terminal and a second terminal, the first terminal of the second resistor coupled to the output of the second comparator and the second terminal of the second resistor coupled to the input of the second amplifier;
a first capacitor having a first terminal and a second terminal, the first terminal of the first capacitor coupled to the output of the first amplifier and the second terminal of the first capacitor coupled to the single ended input of the first amplifier; and
a second capacitor having a first terminal and a second terminal, the first terminal of the second capacitor coupled to the output of the second amplifier and the second terminal of the second capacitor coupled to the input of the second amplifier.

12. The amplification circuit of claim 11, further including:
a buffer having an input and an output; and
a third capacitor having a first terminal and a second terminal, the first terminal of the third capacitor coupled to the output of the buffer and the second terminal of the third capacitor coupled to the single ended input of the first amplifier.

13. A preamplifier, comprising:
a gain stage having a single ended input and an output;
a low pass filter having an input and an output, the input of the low pass filter coupled to the output of the gain stage;
a first comparator having a first input terminal, a second input terminal, and an output terminal, the output terminal of the first comparator coupled to the single ended input terminal of the gain stage to provide a feedback signal that adjusts an output signal at the output of the lowpass filter, wherein a gain of the first comparator is less than 50 decibels; and
a resistor having a first terminal and a second terminal, the first terminal of the resistor coupled to the output of the first comparator and the second terminal of the resistor coupled to the single ended input of the gain stage.

14. The preamplifier of claim 13, further including:
a first capacitor having a first terminal and a second terminal, the first terminal of the first capacitor coupled to the single ended input of the gain stage and the second terminal of the first capacitor coupled to the output of the gain stage;

a second capacitor having a first terminal and a second terminal, the first terminal of the second capacitor coupled for receiving an input signal and the second terminal coupled to the single ended input of the gain stage.

15. The gain stage of claim 13, wherein the gain stage comprises:

a first transistor having a control terminal, a first current carrying terminal, and a second current carrying terminal;

a second transistor having a control terminal, a first current carrying terminal, and a second current carrying terminal, the first current carrying terminal of the first transistor coupled to the second current carrying terminal of the second transistor to form a first node, the control terminal of the first transistor serving as the single ended input of the gain stage, and the control terminal of the second transistor coupled for receiving a bias voltage; and wherein the comparator comprises:

a third transistor having a control terminal, a first current carrying terminal, and a second current carrying terminal, the control terminal of the third transistor serving as the first input of the comparator;

a fourth transistor having a control terminal, a first current carrying terminal, and a second current carrying terminal, the first current carrying terminal of the fourth transistor coupled to the first current carrying terminal of the third transistor, the control terminal of the fourth transistor serving as the second input of the first comparator;

a fifth transistor having a control terminal, a first current carrying terminal, and a second current carrying terminal, the control terminal of the fifth transistor coupled to the first current carrying terminal of the fifth transistor; and a sixth transistor having a control terminal, a first current carrying terminal, and a second current carrying terminal, the control terminal of the sixth transistor coupled to the first current carrying terminal of the sixth transistor; and a seventh transistor having a control terminal, a first current carrying terminal, and a second current carrying terminal, the control terminal of the seventh transistor coupled for receiving the bias voltage and the first current carrying terminal of the seventh transistor coupled to the first current carrying terminals of the third and fourth transistors.

* * * * *